United States Patent
Lang et al.

(10) Patent No.: US 9,618,828 B2
(45) Date of Patent: Apr. 11, 2017

(54) CAMERA WITH HEATING ELEMENT

(71) Applicants: Werner Lang, Ergersheim (DE); Peter Geissendörfer, Ergersheim (DE); Manuel Kunz, Röttingen (DE); Michael Witzke, Ansbach (DE); Stefan Centmayer, Ergersheim (DE); Michael Hornung, Ergersheim (DE)

(72) Inventors: Werner Lang, Ergersheim (DE); Peter Geissendörfer, Ergersheim (DE); Manuel Kunz, Röttingen (DE); Michael Witzke, Ansbach (DE); Stefan Centmayer, Ergersheim (DE); Michael Hornung, Ergersheim (DE)

(73) Assignee: MEKRA LANG GMBH & CO. KG, Ergersheim (DE)

( * ) Notice: Subject to any disclaimer, the term of this patent is extended or adjusted under 35 U.S.C. 154(b) by 0 days.

(21) Appl. No.: 14/566,225

(22) Filed: Dec. 10, 2014

(65) Prior Publication Data

US 2015/0160536 A1 Jun. 11, 2015

(30) Foreign Application Priority Data

Dec. 11, 2013 (DE) .................. 10 2013 020 894

(51) Int. Cl.
*H04N 5/225* (2006.01)
*G03B 17/55* (2006.01)

(52) U.S. Cl.
CPC .......... *G03B 17/55* (2013.01); *H04N 5/2251* (2013.01); *H04N 5/2252* (2013.01); *H04N 5/2254* (2013.01)

(58) Field of Classification Search
CPC .......... G03B 17/55; G01K 7/16; H04N 5/225; H04N 5/23241
See application file for complete search history.

(56) References Cited

U.S. PATENT DOCUMENTS

| 6,061,087 | A  | * | 5/2000  | Schieltz et al. ............... 348/151 |
| 6,850,025 | B1 | * | 2/2005  | Paolantonio et al. ......... 318/685 |
| 2003/0081934 | A1 | * | 5/2003  | Kirmuss ......................... 386/46 |
| 2006/0038108 | A1 | * | 2/2006  | Belau ................... H04N 5/2251 250/208.1 |
| 2006/0108352 | A1 | * | 5/2006  | Fernandez ..................... 219/522 |
| 2006/0171704 | A1 | * | 8/2006  | Bingle et al. ................. 396/419 |
| 2008/0247751 | A1 | * | 10/2008 | Lang et al. .................... 396/542 |

(Continued)

FOREIGN PATENT DOCUMENTS

DE 102 59 795 7/2004
DE 10 2007 043 516 3/2009

(Continued)

*Primary Examiner* — Christopher K Peterson
(74) *Attorney, Agent, or Firm* — Cozen O'Connor

(57) ABSTRACT

A camera for use on vehicles, in particular commercial vehicles. The camera has a housing, at least one optical element disposed within the housing, a group of circuit boards disposed within the housing and including at least one circuit board. The group of circuit boards has at least one active circuit for executing a direct camera function. The camera further comprises at least one heating element adapted for heating the group of circuit boards, the optical elements, and/or the housing, wherein the at least one heating element is directly attached to one of the circuit boards of the group of circuit boards.

20 Claims, 4 Drawing Sheets

(56) References Cited

U.S. PATENT DOCUMENTS

2013/0148059 A1\* 6/2013 Park et al. .................. 349/72
2014/0055608 A1\* 2/2014 Martin ............. G08B 13/19606
                                                                         348/143

FOREIGN PATENT DOCUMENTS

| DE | 10 2011 109 594 | 2/2013 |
|---|---|---|
| DE | 10 2012 015 398 | 10/2013 |
| DE | 10 2012 019 647 | 4/2014 |
| JP | 2003-267130 | 9/2003 |
| JP | 2004-020798 | 1/2004 |
| WO | WO 03/105465 | 12/2003 |

\* cited by examiner

CAMERA WITH HEATING ELEMENT

BACKGROUND OF THE INVENTION

1. Field of the Invention

The present disclosure relates to a camera comprising at least one heating element, in particular to a camera comprising at least one heating element for use on a vehicle, for example, on a commercial vehicle.

2. Description of the Related Art

In recent times it has been increasingly considered to use, besides conventional mirrors as means for indirect vision, in addition to or as replacement for these mirrors, camera systems or image capturing systems as means for indirect vision, wherein an image capturing unit, e.g. a camera, continuously detects a recorded image, and wherein the (video) data captured by the image capturing unit are submitted, for example by means of a calculation unit and possibly after further processing, to a display unit within the driver's cab, which display unit permanently, always visible, and in real time displays the respective captured field of vision and possibly further information, e.g. collision notices, distances or the like, regarding the area around the vehicle.

The cameras are usually attached to the outside of the vehicle and aligned such that the desired field of vision of the vehicle environment can be captured. Thus, the cameras are exposed to weather conditions prevailing at the location of the vehicle. In particular at cold temperatures, for example in winter, the cover glass and/or the camera lens may be covered with frost and/or condensation and, thus, the camera functions may be adversely affected. Here, particularly the optical elements of the camera that are located at the outside of the housing and, thus, in direct contact with the surrounding environment may be covered with frost and/or condensation. Also the function and image quality of cameras arranged on the vehicle, such as, for example, rear-view cameras, may be affected by frost and/or condensation. Especially after repeated formation of condensation and/or frost, these components may eventually suffer damage.

In order to avoid or solve the problem of frost and/or condensation on the outer optical elements of the camera, it is known to arrange heating elements within the camera and in the vicinity of the optical elements, for example, on the object side near the lens and/or the cover glass. This is often relatively complex with regard to installation of the heating elements within the camera housing during the manufacturing process. Moreover, a camera housing usually made of metal has a better thermal conductivity compared to the optical elements usually made of plastics or glass, and thus, when providing the heating elements within the housing, the larger part of the thermal energy introduced by the heating elements is received by the camera housing or possibly even lead away from the optical elements, so that only a minor part of this thermal energy may cause heating of the optical elements.

DE 102 59 795 A1 discloses an image generation device for installation in a roof portion or an exterior mirror of a vehicle. In order to achieve small-dimensional components as well as for thermo technical reasons, the disclosed image generation device is characterized by its structural design. The camera comprises at least one rigid first circuit board for highly complex semi-conductors with at least one optical image capturing sensor, and a second circuit board for all other components, wherein the first and second circuit boards are arranged on, and preferably glued to, a metal base plate.

DE 10 2010 015 398 B3 discloses a mirror replacement system for a vehicle. The mirror replacement system comprises an image capturing unit, a supply unit and a display unit. The display unit is adapted to be arranged within the vehicle and visible for the driver. With regard to sealing, the image capturing unit and the supply unit are arranged in separate installation spaces, and respectively arranged separate from and outside of the display unit.

DE 10 2011 199 594 A1 discloses a device for a motor vehicle, which is formed with a housing and adapted to process image data of an image capturing unit, wherein at least two circuit plates with electronic components for processing image data are arranged in parallel and spaced from each other within the housing, and wherein at least one heat dissipation element is arranged within and/or on the housing, which heat dissipation element serves for dissipating the heat generated during operation of the electronic components.

DE 10 2012 019 647 A1 relates to a camera for a digital rear-view mirror. The disclosed camera comprises a lens and an image sensor, the lens and the image sensor being arranged within a common housing. The electronics for operating the camera are arranged on at least one side of the lens. Thus, the heat dissipated from the circuit boards of the camera electronics may be used for heating up the lens, and, thus, no separate heater is required. As a result, power consumption of the camera may be reduced.

SUMMARY OF THE INVENTION

It is an object of the present disclosure to provide a camera that can be permanently and reliably used outdoors, resist frost and condensations caused by temperature differences and, thus, operate fault-free, while ensuring cost-effective and simple production.

The present disclosure is based at least in part on the idea to provide a camera for use in vehicles, in particular commercial vehicles, the camera comprising a housing, at least one optical element arranged within the housing, at least one group of circuit boards arranged within the housing and provided with at least one circuit board, the group of circuit boards having at least one active circuit for executing a direct camera function, and at least one heating element adapted to heat up the group of circuit boards, the optical element, and/or the housing. The at least one heating element is directly attached to one of the circuit boards of the group of circuit boards, wherein directly attached also includes partially integrating or embedding the at least one heating element in the circuit board of the group of circuit boards. Arrangement of the heating elements directly on one of the circuit boards of the group of circuit boards may be effected alternatively or additionally to further heating devices arranged within the camera, for example heating devices arranged on the object side with regard to the optical element.

The component to be preferably heated up is the component that is in direct contact with the environment and, therefore, exposed to weather conditions. If the camera is, for example, provided with a cover glass, it is primarily the cover glass, which cover glass may also be considered an optical element, that has to be heated up in order to eliminate frost or condensation on said cover glass. In cameras without cover glass, it primarily is the optical element which is in direct contact to the environment that has to be heated up, for example, the lens. Usually, the camera is sealed against entry of moisture.

Within the meaning of the present disclosure, the term "circuit board" means a circuit board that is a carrier for electronic components. The circuit board serves for mechanical attachment and electrical connection. The circuit board is preferably made of an electrically insulating material with conducting connections being provided thereon.

Further, an active circuit is a circuit comprising, for example, semiconductors. The active circuit is adapted to carry out direct functions of the camera. These direct camera functions include all functions directly related to image generation, such as, for example, image capturing, image processing and image display. Examples include the digital image capturing unit (or image sensor), video transmission by means of LVDS (Low Voltage Differential Signaling) serializer, video transmission by means of processors, but also an electric power source, which all carry out direct camera functions.

In contrast to the direct camera functions, indirect camera functions are those functions that are not necessary for image generation. Examples include heaters, infrared illumination, or microphones.

The heating element may be an active component, such as, for example, a semiconductor, or a passive component, such as, for example, a coil, an electrical resistance, etc. Moreover, it may be advantageous to also use the heat generated by the electrical components arranged on the group of circuit boards for heating up the optical element.

Arranging the at least one heating element directly on the circuit board of a group of circuit boards, which is already provided in the camera and has an active circuit for carrying out direct camera functions, allows for efficient and cost-effective production, as no modifications have to be made with regard to the camera housing. The heat transfer to the components to be preferably heated up is increased. Preferably, at least one heating element is applied to the circuit board by means of a resistor layer. The at least one heating element is preferably connected with a power source and, for example, a control device, which supply control signals and electrical energy, which is then converted into heat, to the at least one heating element. Preferably, the electrical connection to the power source and/or to the control device is also printed on the circuit board.

In one embodiment of the present disclosure, the active circuit is a digital image capturing unit. In this case, at least one heating element that is connected with lines on the circuit board for power supply is arranged on the circuit board on which the digital image capturing unit is located. In a further embodiment, the active circuit is adapted to transfer video data to, for example, a display unit arranged within a vehicle, in particular a commercial vehicle, which display unit is visible to the driver. Moreover, in a further embodiment, the active circuit may be adapted for processing the video data which, after processing, are transferred to the display unit. In a further embodiment, the active circuit is an electrical power source supplying the at least one heating element and/or further electronic components of the group of circuit boards with electrical energy.

In one embodiment, the group of circuit boards comprises a single circuit board to which both the digital image capturing unit and the at least one heating element are directly attached. In a further embodiment, the group of circuit boards comprises at least two circuit boards that are electronically or mechanically connected to one another. Here, the digital image capturing unit is provided on one circuit board of the group of circuit boards and the at least one heating element is directly attached to at least one other circuit board of the group of circuit boards.

Preferably, at least one heat conducting element is provided, which is arranged between the at least one heating element and the housing and adapted to transfer heat generated by the heating element and/or the group of circuit boards to the housing. The heat conducting element preferably has a large surface, i.e. a large heat conducting surface, in order to effectively supply and transmit the heat generated by the heating element to the housing and, thus, to the optical element. In order to primarily heat up the optical element, the connection between heating element and the housing, which connection is formed by the heat conducting element, is directly adjacent to the optical element in a preferred embodiment of the present disclosure.

In a further embodiment, at least one heating element is attached on a side of the circuit board of the group of circuit boards, which side is facing away from the optical element. Alternatively or additionally, at least one heating element is attached on a side of a circuit board of the group of circuit boards, which side is facing the optical element. Moreover, at least one heating element may be arranged and adapted to supply convective heat to the optical element, for example, a lens with lens system, by arranging the heating element such that one radiating surface of the heating element faces the optical element and/or is arranged directly adjacent to the optical element. In one embodiment of the present disclosure, where the group of circuit boards comprises at least two circuit boards, heating elements may be arranged on the side(s) of at least one of the circuit boards of the group of circuit boards facing away from and/or facing the optical element.

In a preferred embodiment, at least one heat conducting element is directly arranged between a circuit board of the group of circuit boards and the housing and/or directly between the at least one heating element and the housing. The heat conducting element is preferably made of a material having good thermal conductivity, like silver, copper, and/or aluminum. At least one heat conducting element is preferably a heat conductive adhesive, a thermal paste and/or a heat conducting pad. The heat conducing element may, for example, be a single-component epoxy resin adhesive made of solvent-free reaction resin, or an adhesive with fillers to which solid components like quartz powder, chalk, metal powder, soot etc. are added in order to improve thermal conductivity. In one embodiment, at least one circuit board of the group of circuit boards is fixed to the housing by means of at least one heat conducting element. In a preferred embodiment, the heat conducing element fully extends over at least one heating element that is attached to a circuit board of the group of circuit boards, so that the surface for effective heat transfer is maximized.

In a further embodiment, a temperature sensor is provided within the camera housing in order to detect the temperature within the housing. The temperature sensor detects the temperature within the housing and provides a corresponding temperature signal to a control unit connected to the temperature sensor, which control unit is adapted to control the at least one heating element in dependency of the temperature detected by the temperature sensor. Thus, the thermal performance of at least one heating element may be effectively controlled, i.e. the at least one heating element only emits heat if the temperature within the housing drops below a predefined threshold. Moreover, the thermal output of the at least one heat conducting element may be proportional to the temperature within the housing, i.e. higher at low temperatures than at high temperatures. Also, the temperature sensor as well as respective control elements for the heating element may be arranged on a circuit board of the group of circuit boards.

In a further embodiment, at least one heating element is dependent on the temperature within the housing, i.e. its thermal performance depends on the temperature within the housing.

Moreover, in preferred embodiments, a cover glass is provided which, in such embodiments, is considered to be the optical element to be heated up. The cover glass may seal the housing on the object-side in an airtight and/or watertight manner. The cover glass is preferably connected to the housing and is also heated up by the housing, which is heated by the at least one heating element, so that frost and/or condensation forming on the cover glass may be avoided or eliminated.

The inside of the camera housing is divided into, for example, cylindrical inner portions having different diameters and graduations, although other shapes of the inner portions are conceivable. Here, one circuit board of the group of circuit boards is preferably mounted to a ring-shaped housing inner flange surface of an inner portion. The optical element is screwed into a cylindrical inner portion of the housing via a thread whose diameter is equal to or smaller than the internal diameter of the housing inner flange surface.

The camera according to the present disclosure may be applied wherever an outdoor operation requires the ability to withstand weather conditions like frost and/or dew and/or condensation. The camera according to the present disclosure may, for example, be used for monitoring property, public places, or public transport.

Within the meaning of the present disclosure, "directly" attaching, arranging or connecting a component with regard to another component means that no third component is located between the two components. Directly attaching, for example, the heating element to a circuit board of the group of circuit boards means that no further component is located between the heating element and the respective circuit board. Merely the use of an adhesive, a screw connection, or a welding connection between the two components is allowed, so that the two components are still directly attached, arranged, connected, and/or contacted to one another.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the following, the present disclosure will be explained in an exemplary manner by means of the accompanying drawings, in which.

DETAILED DESCRIPTION OF THE PRESENTLY PREFERRED EMBODIMENTS

Figure 1:
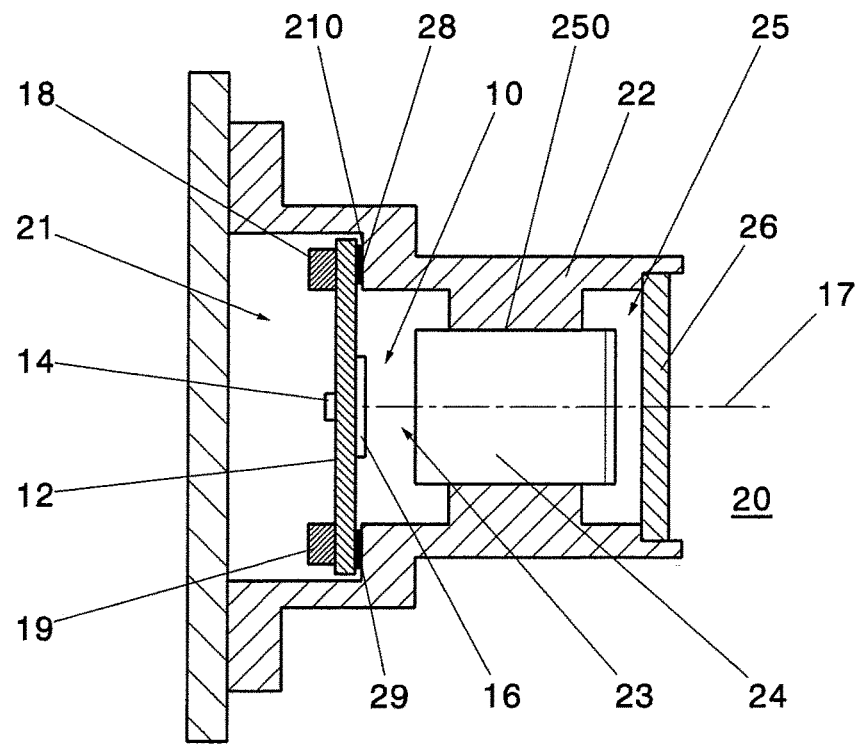
FIG. 1 shows a sectional view of a first embodiment of a camera according to the present disclosure, the camera being provided with at least one heating element.

FIG. 1 shows a first embodiment of a camera 20 according to the present disclosure. The camera 20 is provided with a housing 22 including cylindrical inner portions 21, 23, 25 having different diameters. A group of circuit boards having a single circuit board 10, which is arranged in the inner portion 21, and an optical element 24, which is arranged in the inner portion 25 whose diameter is smaller than the diameter of inner portion 21, are arranged within the housing 22. The inner portion 25 is stepped with regard to the inner portion 23 and has a housing inner flange surface 210. The circuit board 10 is attached to a housing inner flange surface 210. The optical element 24 is, for example, a lens with lens system and is screwed into the housing 22 at the inner portion 25, whose diameter is smaller than the diameter of inner portion 23, by means of a thread 250. On the object-side, the housing 22 is sealed in an airtight and/or watertight manner by a further optical element in the form of a cover glass 26. The cover glass 26 is exposed to the environment and to weather conditions. As can be further taken from FIG. 1, a digital image capturing unit 16, through which an optical axis 17 of the camera extends, is provided on a side of the circuit board 12 which faces the optical element 24.

In the embodiment shown in FIG. 1, two heating elements 18, 19 are attached to a side of the circuit board 12 of the circuit board 10 which faces away from the optical element 24, for example, by means of a resistor layer. Further, at least one electronic component 14 is attached to a side of circuit board 12 which faces away from the optical element 24. Within the meaning of the present disclosure, the electronic component 14 is an active circuit for carrying out direct camera functions.

Two heat conducting elements 28, 29, which are adapted to transfer heat from the circuit board 12 into the housing 22, are provided for attaching the circuit board 10 to the housing 22. In addition to the heating elements 18, 19, an attachment device may be provided, which fixes the circuit board 10 to the housing 22. The housing 22, which is preferably made of thermally conductive material like, for example, metal, can transfer the heat generated by the heating elements 18, 19 to the optical elements 24, 26. The optical element 24 at least partially extends from the inner portion 25 into the inner portion 23.

When actuating the heating elements 18, 19, firstly, circuit board 12 is heated up. Simultaneously, the left portion of the housing 22 (see FIG. 1) is at least partially heated up by the heating elements 18, 19 by means of convection. The heated circuit board 12, which is connected to the heat conducting elements 28, 29, transfers the heat into the housing 22. The heat of the housing 22 is then transferred to the optical element 24 and to the cover glass 26 via a thread 250, and frost and/or condensations on these components are eliminated or a formation thereof is prevented. Here, it is preferable to provide a long thread 250, which extends almost over the entire length of the optical element 24, in order to maximize the effective heat transfer surface between the housing 22 and the optical element 24. Moreover, it is preferable to fix the cover glass 26 to the housing 22 by means of a heat conducting attachment, so that the cover glass 26 may be effectively heated up.

Figure 2:
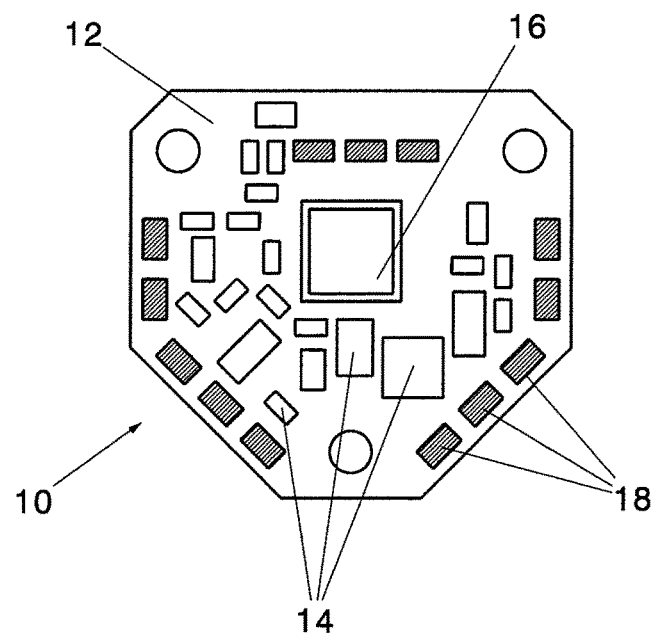
FIG. 2 shows a schematic plan view of a circuit board.

FIG. 2 shows a schematic plan view of an exemplary circuit board 10 comprising a circuit board 12 with at least one electronic component 14 arranged thereon, as well as conductors and circuits that are not explicitly shown. The digital image capturing unit 16 is arranged on the circuit board 12. The digital image capturing unit 16 is, for example, a CCD- or CMOS sensor, which comprises light sensitive electronic components, which function is based on the inner photo effect.

At least one heating element 18 is directly attached to the circuit board 12. In the example shown in FIG. 2, a total of 13 heating elements are arranged across one side of the circuit board 12; the number of heating elements may, however, vary. In further embodiments, at least one heating element may be additionally or alternatively provided on the rear side of the circuit board 12. Preferably, the heating elements 18 are arranged at the outer edge of circuit board 12. The at least one heating element 18 is connected with a control unit (not shown) via not explicitly shown lines, and is controlled and supplied with electrical energy by this control unit. The at least one heating element 18 is adapted to transform the electrical energy supplied by the control unit to thermal energy.

Figure 3:
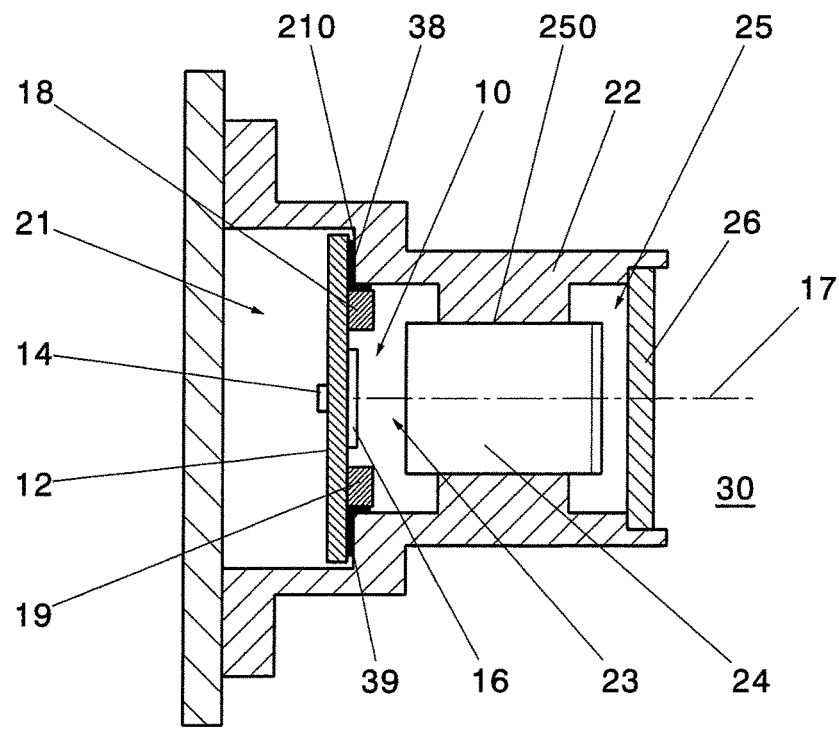
FIG. 3 shows a sectional view of a further embodiment of a camera according to the present disclosure, the camera being provided with at least one heating element.

Referring to FIG. 3, a further embodiment of the camera 30 according to the present disclosure is shown. The camera 30 of FIG. 3 differs from camera 20 of FIG. 2 in the arrangement of the heating elements 18, 19 on the circuit board 12 with regard to the optical element 24 and the heat conducting elements 38, 39. According to FIG. 3, two heating elements 18 are attached to a side of the circuit board 12 which faces the optical element 24. Two heat conducting elements 38, 39 are attached to the ring-shaped housing inner flange surface 210 and, thus, fix circuit board 10 to the housing 22 at the inner portion 21. The two heating elements 18, 19 extend from the circuit board 12 and at least partially into the inner portion 23, into which portion also the optical element 24, which is screwed to the housing 22 via the thread 250, protrudes. According to the embodiment shown in FIG. 3, the heat conducting elements 38, 39 extend between the cylinder surface of inner portion 23 and the lateral surface of the heating elements 18, 19.

Thus, the heating elements 18, 19 may both heat up the circuit board 12 by means of direct contact and the optical elements 24, 26 by means of convection. Moreover, due to the configuration of the heat conducting elements 38, 39, heat transfer takes place both directly between the circuit board 12 and the housing 22, and directly between the heating elements 18, 19 and the housing 22. The heat conducting housing 22 may transfer this heat to the optical elements 24, 26.

When actuating the heating elements 18, 19, firstly, the circuit board 12 and, via heat conducting elements 38, 39, the housing 22 are heated. Further, heat transfer takes place between the heated circuit board 12 and the housing 22 due to the heat conducting elements 38, 39 that are arranged therebetween. The heated housing 22 may then produce a heat input to the optical element 24 and the cover glass 26 in order to eliminate frost and/or condensation thereon or to prevent formation of the same. Further, both the housing 22 and the optical element 24 may be heated up by the heating elements 18, 19 by means of heat convection.

Figure 4:
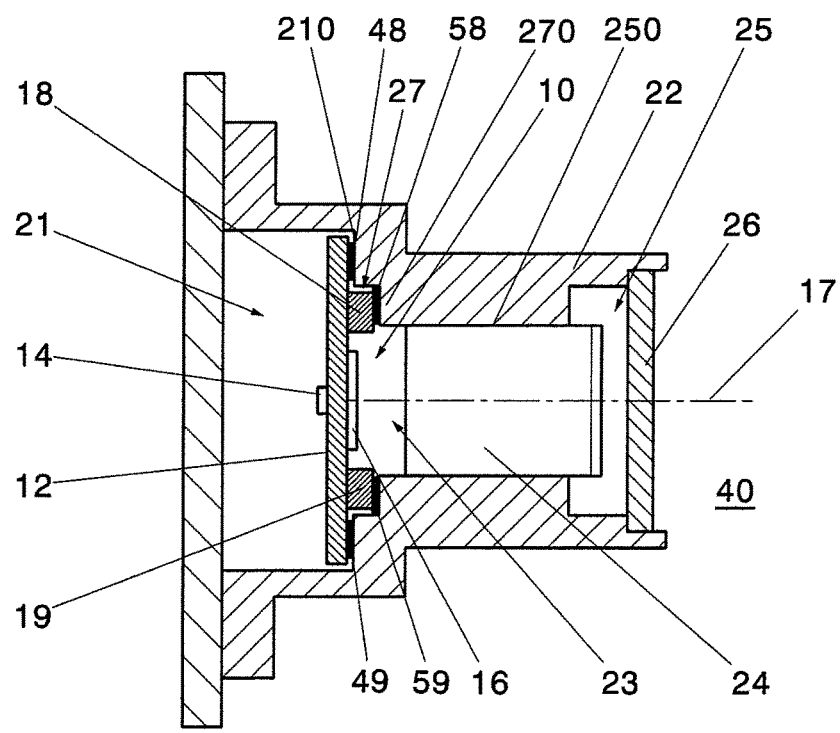
FIG. 4 shows a sectional view of a further embodiment of a camera according to the present disclosure, the camera being provided with at least one heating element.

Referring now to FIG. 4, a further embodiment of a camera 40 according to the present disclosure is shown. The camera 40 of FIG. 4 differs from camera 30 of FIG. 3 in the configuration of housing 22 which, besides inner portions 21, 23, 25, comprises a stepped cylindrical inner portion 27 arranged within the inner portion 21 and the inner portion 23, as well as in the arrangement of the heat conducting elements 48, 49, 58, 59. Thus, in addition to the ring-shaped housing inner flange surface 210, the housing 22 also comprises a further ring-shaped housing inner flange surface 270, which is parallel with regard to the inner flange surface 210 of the housing. Consequently housing 22 is provided with the additional inner portion 27 into which the heating elements 18, 19 at least partially extend. As already shown in FIG. 1, the heat conducting elements 48, 49 are provided directly between the circuit board 12 and the housing 22 at the housing inner flange surface 210, in order to directly transfer the heat from the circuit board 12 to the housing 22. The two additional heat conducting elements 58, 59 are directly provided at the additional housing inner flange surface 270 and are in contact with the heating elements 18, 19 and the housing 22, such that the heat from the heating elements 18, 19 is directly transferred into the housing 22.

When the heating elements 18, 19 shown in FIG. 4 are actuated, a direct heat transfer to the circuit board 12 and, via the heat conducting elements 58, 59, into the housing 22 takes place. The housing 22 is further heated up by the heated circuit board 12 via heat conducting elements 48, 49, and directly by the heating elements 18, 19 by means of heat convection. The thermal energy introduced into the housing 22 is then transferred to the optical element 24 and the cover glass 26. The optical element 24 is also directly heated up by the heating elements 18, 19 by means of heat convection.

Figure 5:
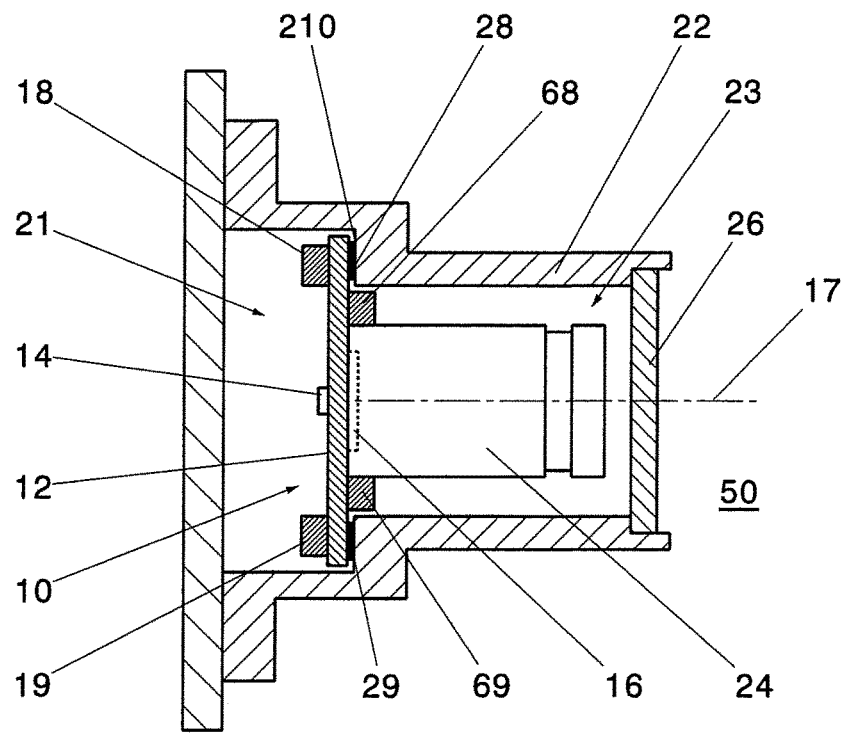
FIG. 5 shows a sectional view of a further embodiment of a camera according to the present disclosure, the camera being provided with at least one heating element.

Referring now to FIG. 5, a further embodiment of a camera 50 according to the present disclosure is shown. The camera 50 of FIG. 5 differs from camera 20 of FIG. 1 in the configuration of the optical element 24 which is, instead of being screwed into the housing 22, directly attached to the circuit board 10, as well as in the number of heating elements 18, 19. In addition to the heating elements 18, 19, the camera 50 is provided with further heating elements 68, 69, which are arranged on a side facing away from heating elements 18, 19. The optical element 24 is focusable for adjusting the sharpness of the captured images, which is indicated by the circumferential groove in FIG. 5. The heating elements 68, 69 contact the optical element 24, so that heat is directly transferred into the optical element 24.

When the heating elements 18, 19, 58, 59 shown in FIG. 5 are actuated, direct heat transfer into the circuit board 12 and, via heat conducting elements 28, 29, into the housing 22 takes place. The left side of housing 22 is additionally heated up by the heating elements 18, 19 by means of heat convection. Moreover, a direct heat transfer of heating elements 68, 69 into the optical element 24 and, by means of heat convection, into the housing 22 and at least partially into the cover glass 26 takes place. The heat introduced into the housing 22 is then transferred to the cover glass 26, which is heated.

Figure 6:
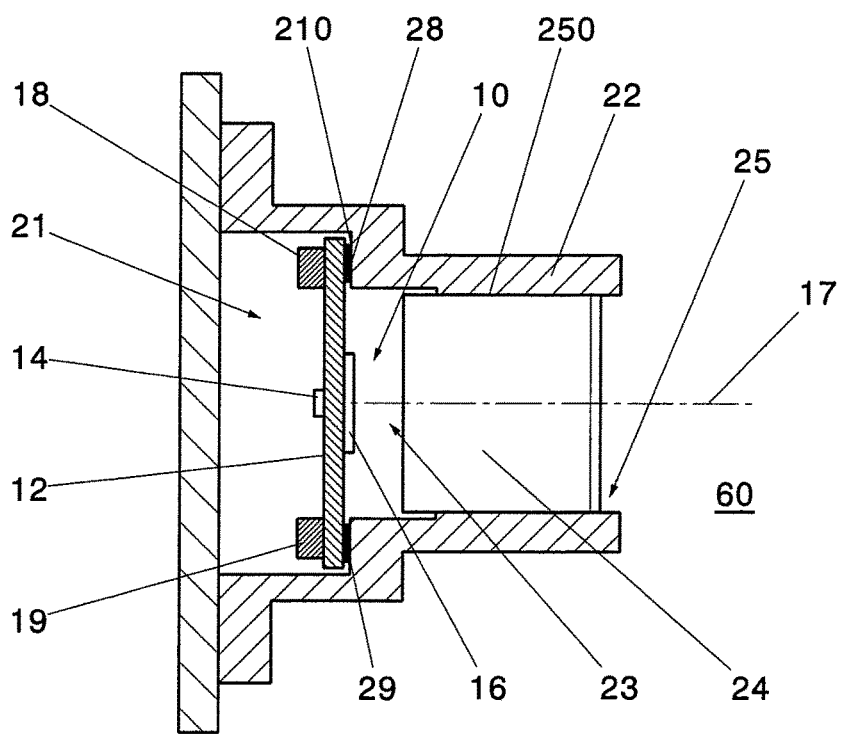
FIG. 6 shows a sectional view of a further embodiment of a camera according to the present disclosure, the camera being provided with at least one heating element.

Referring now to FIG. 6, a further embodiment of a camera 60 according to the present disclosure is shown. The camera 60 of FIG. 6 merely differs from camera 20 of FIG. 1 in that no cover glass 26 is provided. The configuration of circuit board 10, heating elements 18, 19, and heat conducting elements 28, 29 is almost identical in FIGS. 1 and 6. In the camera 60 without cover glass, the component to be preferably heated is the optical element 24; the heating principle corresponds to that described with regard to FIG. 1.

Figure 7:
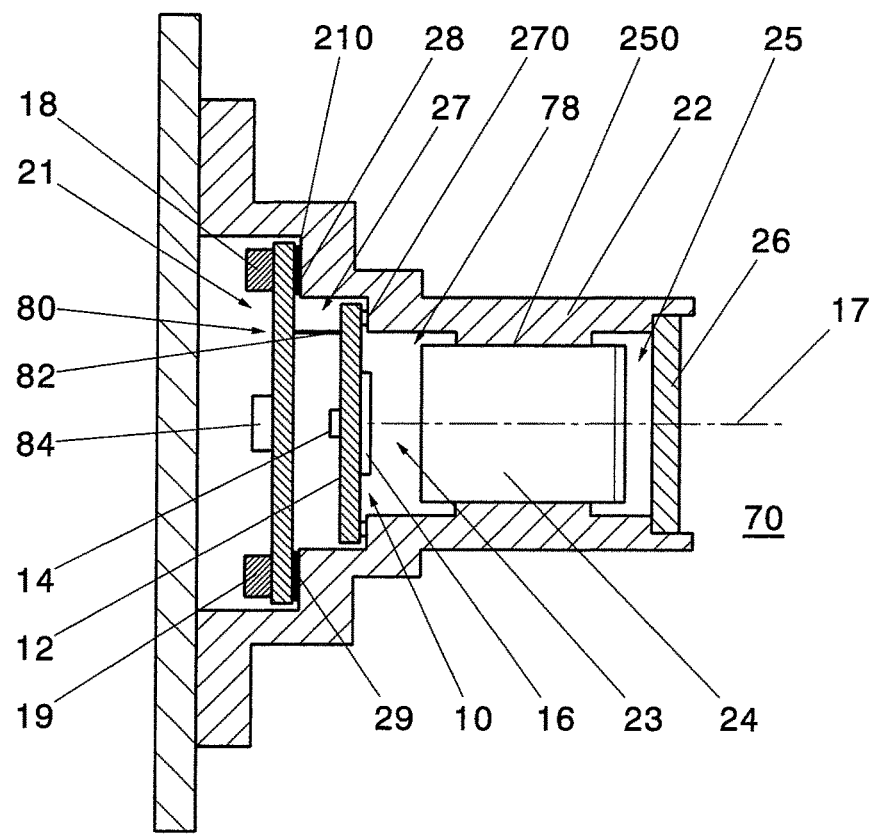
FIG. 7 shows a sectional view of a further embodiment of the camera according to the present disclosure, the camera being provided with at least one heating element.

Referring to FIG. 7, a further embodiment of a camera 70 according to the present disclosure is shown. The camera 70 of FIG. 7 differs from the previously described cameras 20 to 60 in that the group of circuit boards comprises two circuit boards, i.e. a first circuit board 10 and a second circuit board 80, which are connected to one another via an electric connection 82. The digital image capturing unit 16 is attached to the first circuit board 10. The heating elements 18, 19 are attached to the second circuit board 80, which, with regard to the first circuit board 10, is arranged within the housing 22 on a side facing away from the optical element 24. The housing 22 of FIG. 7 is almost identical to the housing 22 of FIG. 4 and, thus, comprises inner surfaces 21, 23, 25, 27 having housing inner flange portions 210 and 270. The second circuit board 80 is, similar to the circuit board 10 of FIG. 1, attached to the inner flange surface 210 via heat conducting elements 28, 29, and the first circuit board 10 is attached to the housing inner flange surface 270 via attachment means. Further, an active circuit 84 is provided on the second circuit board 80 and, at least partially, controls operation of the camera 70. In a further embodiment, the active circuit 84 may, for example, be an electrical power source, which supplies all circuit boards of the group of circuit boards with electrical energy.

In the embodiment shown in FIG. 7, additional heating elements may be provided on one or both sides of the first circuit board 10, and transfer heat into the housing 22 and/or the optical element 24 and/or the cover glass 26. Here, also heat conducting elements that effectively transfer the heat generated by the heating elements, which are arranged on the first circuit board, into the housing 22, are advantageous.

Figure 8:
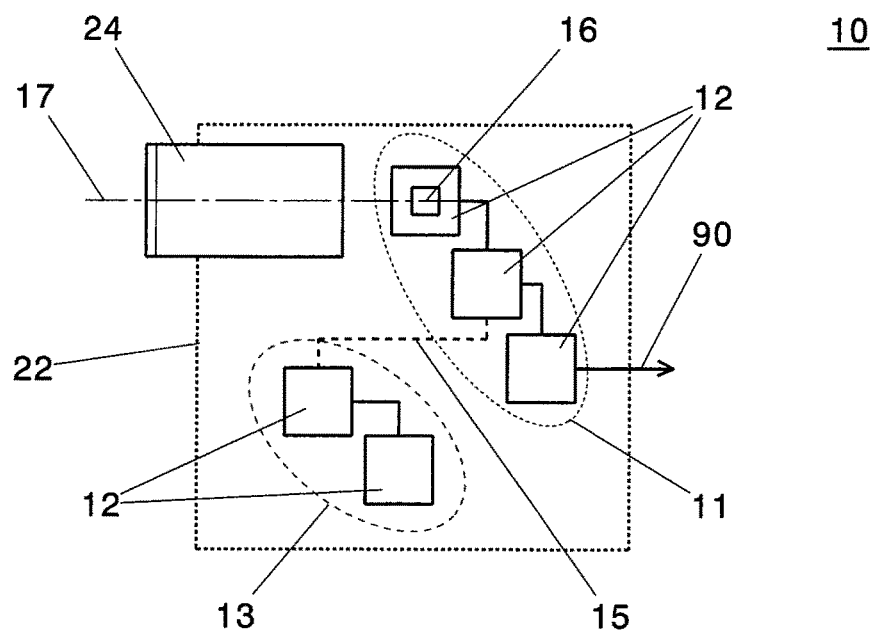
FIG. 8 shows a schematic chart of a camera with the group of circuit boards.

FIG. 8 is a schematic chart of a camera 10, wherein the housing 22 is schematically shown by a dotted line. The optical element 24 is at least partially arranged within the housing 22. The optical axis 17 extends through the optical element 24 and the digital image capturing unit 16, which are arranged on a circuit board 12 of a first group of circuit boards 11. The circuit boards 12 of the first group of circuit boards 11 (in FIG. 8, the first group of circuit boards 11 is exemplarily shown with three circuit boards) are provided with at least one active circuit adapted for executing direct camera functions. Moreover, in FIG. 8, a second group of circuit boards 13 is shown, which group is also provided with circuit boards 12 (in FIG. 8, the group of circuit boards is exemplarily shown with two circuit boards). The circuit boards 12 of the second group of circuit boards 13 are, however, adapted to execute indirect camera functions.

The circuit boards 12 of the first group of circuit boards 11 may be connected with the circuit boards 12 of the second group of circuit boards 13 via a connecting line 15. The connecting line 15 may supply, for example, electrical energy to the group of circuit boards 13. The connecting line 15 is, however, optional. In this case, the circuit boards 12 of the second group of circuit boards 13 may be separately actuated. The video data of the circuit boards 12 of the first group of circuit boards 11 are transferred via an output line 90 to a display unit for displaying the image captured by the camera.

In all of the embodiments shown, the optical element 24 and/or the cover glass 26 may be heated by the heat introduced into the housing 22 by the heating elements 18, 19, 68, 69, and thus formation of frost and/or condensation on the optical element 24 and/or the cover glass 26 may be avoided. Again, it should be noted that it is the component directly exposed to the weather conditions of the environment, which should be heated up. Moreover, frost and/or condensation that have already formed on the optical element 24 and/or the cover glass 26 may be eliminated by means of the introduced heat. Further, by means of the heating elements 18, 19, 68, 69, it is possible to protect both the optical element 24 and/or the cover glass 26 and the electronic components 14 and the digital image capturing unit 16 from frost and/or condensation, or to eliminate the same.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A camera for use on vehicles, comprising:
a unitary housing;
at least one optical element disposed within and in contact with the unitary housing;
at least one group of circuit boards disposed within the unitary housing and including at least one circuit board, the at least one group of circuit boards having at least one active circuit for executing a direct camera function;
at least one heating element arranged and adapted to heat the group of circuit boards, the optical element and/or the unitary housing, the at least one heating element being directly attached to one of the circuit boards of the group of circuit boards;
one or more heat conducting elements disposed between the at least one heating element and the unitary housing and adapted to transfer the heat of the heating element and/or the group of circuit boards to the unitary housing; and
a cover glass configured to seal the unitary housing,
wherein at least one of the one or more heat conducting elements directly contacts at least one circuit board, and
wherein the unitary housing directly contacts the cover glass and directly contacts the optical element.

2. The camera according to claim 1, wherein at least one active circuit is a digital image capturing unit.

3. The camera according to claim 2, wherein the digital image capturing unit and the at least one heating element are provided together on one of the circuit boards of the group of circuit boards.

4. The camera according to claim 1, wherein at least one active circuit is adapted to transfer video data to a display unit.

5. The camera according to claim 1, wherein at least one active circuit is adapted to process video data.

6. The camera according to claim 1, wherein at least one active circuit is an electrical power source.

7. The camera according to claim 1, wherein at least one heating element is mounted to a side of a circuit board of the group of circuit boards, which side is facing away from the optical element.

8. The camera according to claim 1, wherein at least one heating element is mounted to a side of a circuit board of the group of circuit boards, which side is facing the optical element.

9. The camera according to claim 1, wherein at least one heat conducting element is directly disposed between a circuit board of the group of circuit boards and the unitary housing.

10. The camera according to claim 1, wherein at least one heat conducting element is directly disposed between at least one heating element and the unitary housing.

11. The camera according to claim 1, wherein the at least one heat conducting element is a heat conductive adhesive, a thermal paste and/or a heat conducting pad.

12. The camera according to claim 1, wherein at least one heating element is directly attached to a circuit board of the group of circuit boards by means of a resistor layer.

13. The camera according to claim 1, further comprising:
a temperature sensor disposed within the unitary housing and configured to detect a temperature within the unitary housing; and
a control unit for controlling the at least one heating element in relation to the temperature detected by the temperature sensor.

14. The camera according to claim 1, wherein the at least one heating element is a heating element dependent on the temperature within the unitary housing, whose heating performance is dependent on the temperature within the unitary housing.

15. The camera according to claim 1, wherein at least one of the heat conducting elements directly contacts the at least one circuit board and directly contacts the unitary housing.

16. The camera according to claim 1, wherein the optical element comprises a lens that is screwed into the housing at an inner portion of the housing.

17. The camera according to claim 1, wherein the cover glass is positioned to be spaced from the at least one optical element.

18. A camera for use on vehicles, comprising:
a unitary housing;
at least one optical element disposed within and in contact with the unitary housing;
at least one group of circuit boards disposed within the unitary housing and including at least one circuit board, the at least one group of circuit boards having at least one active circuit for executing a direct camera function;
at least one heating element arranged and adapted to heat the group of circuit boards, the optical element and/or the unitary housing, the at least one heating element being directly attached to one of the circuit boards of the group of circuit boards;
at least one heat conducting element disposed between the at least one heating element and the unitary housing and adapted to transfer the heat of the heating element and/or the group of circuit boards to the unitary housing;
a cover glass configured to seal the unitary housing,
wherein the at least one heat conducting element directly contacts the unitary housing and at least one of the at least one circuit board and the heating element, and
wherein the unitary housing directly contacts the cover glass and directly contacts the optical element.

19. The camera according to claim 18, wherein the optical element comprises a lens that is screwed into the housing at an inner portion of the housing.

20. The camera according to claim 18, wherein the cover glass is positioned to spaced from the at least one optical element.

* * * * *